United States Patent [19]
Kim et al.

[11] Patent Number: 5,270,263
[45] Date of Patent: Dec. 14, 1993

[54] PROCESS FOR DEPOSITING ALUMINUM NITRIDE (ALN) USING NITROGEN PLASMA SPUTTERING

[75] Inventors: Sung C. Kim; Chris C. Yu; Trung T. Doan, all of Boise, Id.

[73] Assignee: Micron Technology, Inc., Boise, Id.

[21] Appl. No.: 810,837

[22] Filed: Dec. 20, 1991

[51] Int. Cl.$^5$ ............... H01L 21/465; C23C 14/00
[52] U.S. Cl. ............................. 437/228; 437/236; 204/192.22; 204/192.25; 156/663
[58] Field of Search ............ 437/187, 228, 236; 204/192.22, 192.25; 148/DIG. 113, DIG. 158; 156/663

[56] References Cited

U.S. PATENT DOCUMENTS

| | | | |
|---|---|---|---|
| 3,600,218 | 8/1971 | Pennebaker | 148/DIG. 113 X |
| 3,634,149 | 1/1972 | Knippenberg et al. | 148/175 |
| 4,030,942 | 6/1977 | Keenan et al. | 148/1.5 |
| 4,152,182 | 5/1979 | Rutz | 148/175 |
| 4,761,345 | 8/1988 | Sato et al. | 428/552 |
| 4,795,679 | 1/1989 | Ramesh et al. | 428/428 |
| 4,796,077 | 1/1989 | Takeda et al. | 357/67 |
| 4,843,038 | 6/1989 | Kuratani et al. | 501/98 |
| 4,987,102 | 1/1991 | Nguyen et al. | 437/238 |
| 5,075,641 | 12/1991 | Weber et al. | 357/51 X |

Primary Examiner—John S. Maples
Attorney, Agent, or Firm—Stephen A. Gratton

[57] ABSTRACT

A process for depositing a thin film of aluminum nitride (AlN) includes sputtering an aluminum target with energetic nitrogen ions generated in a nitrogen plasma. A single gas (i.e. nitrogen) is used as both the reactive gas and as the sputtering gas. The process is especially adapted for forming an etchstop layer for use in forming contact vias through a dielectric layer in semiconductor manufacture. The process is also useful in semiconductor manufacture for forming an aluminum nitride (AlN) film that may be used as a passivation layer, as a ceramic packaging material, as a mask for ion implantation, as a substrate material in hybrid circuits, and as a high bandgap window for GaAs solar cells.

8 Claims, 4 Drawing Sheets

PROCESS FOR DEPOSITING ALUMINUM NITRIDE (ALN) USING NITROGEN PLASMA SPUTTERING

TECHNICAL FIELD

This invention relates to thin film processes and more particularly to a process for depositing a film of aluminum nitride (AlN) using nitrogen plasma reactive sputtering. The process of the invention is particularly but not exclusively adapted to semiconductor manufacture and for forming an etchstop layer.

BACKGROUND OF THE INVENTION

In semiconductor manufacture it often necessary to deposit a thin film over a substrate or over another film on the substrate. One film material that has characteristics suitable for semiconductor manufacture is aluminum nitride (AlN). Among the useful properties of aluminum nitride (AlN) are a high thermal conductivity, a close thermal expansion match to a Si substrate, and good mechanical strength. Table 1 lists the properties of aluminum nitride (AIN):

TABLE 1

| Properties of Aluminum Nitride (AlN) | |
|---|---|
| Dielectric constant | 8.8 |
| Resistivity (ohm-cm) | $5 \times 10e13$ |
| Bandgap (eV) | 6.2 |
| Grain size (um, bulk value) | 3-5 |
| Density (g/cm3, bulk value) | 3.25 |
| Thermal expansion coefficient (1/K) | $2.6 \times 10e(-6)$ |
| Flexural strength (MPa) | 300 |
| Thermal conductivity (W/cmK) | 1.5 |
| Melting point (°C) | 2400 |
| Refractive index | 2.0 |

Such properties allow aluminum nitride (AlN) to be used in semiconductor device packaging and in semiconductor manufacture as an ion implantation mask. In these applications the electronic configuration of both aluminum and nitrogen allow the atoms to assume substitution sites in the silicon crystal lattice structure. Hence they will not introduce or nucleate stacking faults. These properties also allow aluminum nitride (AlN) to be used as a thermally conductive dielectric barrier in various semiconductor devices and to provide a high bandgap window for GaAs solar cells used in semiconductor devices.

Despite these useful characteristics of aluminum nitride (AlN), its relatively high fabrication cost has prevented its wide use in the microelectronic industry. Being a high temperature material, in order to have suitable device characteristics, for some applications, aluminum nitride (AlN) requires formation and fabrication at temperatures so high that many of the materials involved in the process react and adversely affect the electronic properties of the film. Accordingly relatively complex and expensive manufacturing processes are required. U.S. Pat. No. 4,152,182 to Rutz for instance, discloses such a process wherein aluminum nitride (AlN) is synthesized and grown epitaxially on an (Al$_2$O$_3$) substrate. Temperatures in excess of 1900° C. are required. This high temperature process is required to provide a high quality aluminum nitride (AlN) film.

It is also known to deposit an aluminum nitride (AlN) film using chemical vapor deposition (CVD) or sputtering. A (CVD) process, in general will not provide a film as high in quality as an epitaxially grown film but can be used to provide a film with better step coverage. U.S. Pat. No. 4,030,942 to Keenan et al. discloses the use of an aluminum nitride (AlN) film as an ion implantation mask in semiconductor manufacture. A (CVD) process is used to deposit the aluminum nitride (AlN). The disclosed (CVD) process is relatively complicated and requires the use of several process gases including hydrogen, NH$_3$ and stoichiometric quantities of aluminum chloride. With the use of such a large number of gases, impurities may be introduced into the deposited (AlN) film. These impurities have any adverse affect on the completed semiconductor devices.

In addition to this fundamental problem, both of the cited references are relatively complicated and expensive processes not generally suited to large scale repetitive semiconductor manufacture. In view of the foregoing, there is a need in the art for an improved process for depositing a thin film of high purity aluminum nitride (AlN). Accordingly, it is an object of the present invention to provide a process for depositing aluminum nitride (AlN) using nitrogen plasma sputtering. It is a further object of the present invention to provide an improved process for depositing aluminum nitride (AlN) in a semiconductor manufacturing process having a quality suitable for semiconductor devices. Yet another object of the present invention is to provide a deposition process for aluminum nitride (AlN) that is simple, cost effective and repetitive.

One application where the process of the invention is particularly suited is in the formation of an etchstop layer for semiconductor fabrication. As semiconductor device dimensions continues to shrink, the depth of an implanted area on a Si wafer substrate, such as an active area, becomes increasingly shallower due to the scaling in the device dimensions. This puts a limit on the amount of overetch allowed during a contact etch process through an oxide layer to the substrate, since excessive overetch will consume the Si in an implanted junction, resulting in device degradation. Unfortunately, overetch is often required in a contact etch process in order to (1) making sure that all contact holes are properly etched across the wafer and (2) in cases where two types of contact with two different desired contact depths are present on the same Si wafer. In the later case, in order to open the deeper contact, the shallower contact will be overetched. In order to eliminate Si consumption during any overetch step, an etchstop which consists of a thin layer of a desired material of a slower etch rate than that of the material to be etched (i.e. oxide) can be used. The etchstop layer is usually deposited above the implanted Si substrate (contact junction) and below the oxide layer through which the contact holes will be opened. In a contact etch process, when an etchstop of a much lower etch rate than that of oxide is used, the etch will stop on the etchstop layer during the overetch step, preventing the underlying Si junction from being consumed by the etch process. Therefore, with the help of an etchstop layer between the Si junction and oxide layer, an overetch can be allowed. The process of the invention is especially suited to forming an etchstop in this application.

SUMMARY OF THE INVENTION

In accordance with the present invention a novel process for depositing a thin film of aluminum nitride (AlN) is provided. Simply stated, with the process of the invention an aluminum nitride (AlN) film is deposited in a conventional sputtering apparatus by sputtering an aluminum target with energetic nitrogen ions generated in a nitrogen plasma. A single gas (i.e. nitrogen) is used as both the reactive gas and as the sputtering gas.

The process of the invention is especially suited to semiconductor manufacture for forming an aluminum nitride (AlN) film having a high purity. One such application, is in the formation of an etchstop layer during semiconductor fabrication. A representative process sequence can include the following steps:

1. Device formation on a silicon substrate using standard processes.
2. Aluminum nitride (AlN) deposition using nitrogen plasma reactive sputtering with nitrogen used as both the reactive gas and as the sputtering gas.
3. Dielectric or doped oxide deposition.
4. Photopatterning to define the regions in the oxide layer to be etched at contact etch step.
5. Contact etch through the oxide layer using reactive ion etch. The etch will stop on the aluminum nitride (AlN) layer. Due to the high etch selectivity of aluminum nitride (AlN) to oxide (oxide etches much faster than aluminum nitride), the etch will stop on the aluminum nitride (AlN), leaving the underlying Si junction intact.
6. Photoresist strip.
7. Strip off the remaining aluminum nitride (AlN) layer using either wet or dry etch.
8. Standard processes from then on.

This is but one example wherein an aluminum nitride (AlN) layer can be formed in accordance with the invention during semiconductor manufacture. Other objects, advantages, and capabilities of the present invention will become more apparent as the description proceeds.

DESCRIPTION OF PREFERRED EMBODIMENTS

Figure 1:
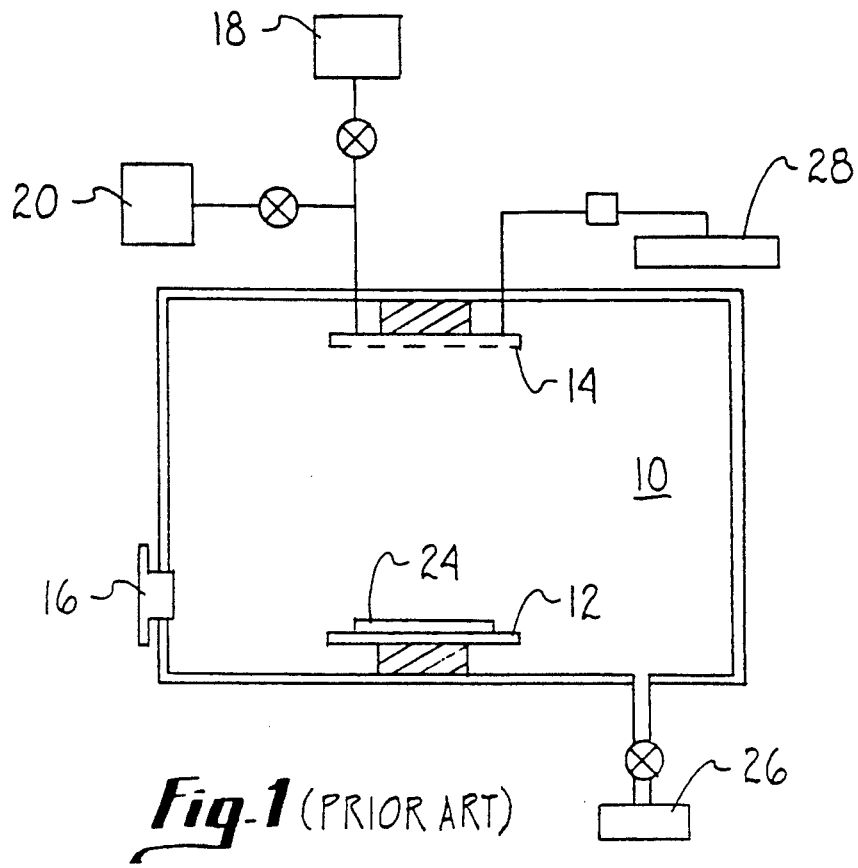
FIG. 1 is a schematic diagram of an apparatus for depositing an aluminum nitride (AlN) film in accordance with a prior art process.

Referring now to FIG. 1 a representative prior art method of depositing a thin film of aluminum nitride (AlN) on a semiconductor wafer is shown. The prior art method is a plasma enhanced chemical vapor deposition (PECVD) process. The prior art process simply stated uses a plasma established by a radio frequency induced glow discharge. Both an inert sputter gas such as argon and an nitrogen reactive gas are required.

The apparatus for carrying out the prior art process includes a vacuum chamber 10 that encloses a lower grounded electrode 12 and an upper powered electrode 14. The powered electrode 14 may include a target formed of pure aluminum. Semiconductor wafers 24 to be processed are loaded into the vacuum chamber 10 by means of an access door 16 and are placed upon a grounded electrode 12.

Inside the vacuum chamber 10 electrodes 12 and 14 have generally planar surfaces and are parallel to one another. Both grounded electrode 12 and powered electrode 14 are electrically insulated from the walls of the chamber 10. Powered electrode 14 is adapted to dispense the inert gas from an inert sputter gas source 18 and the nitrogen ($N_2$) gas from a nitrogen gas source 20 into the space between the electrodes 12 and 14. A vacuum source 26 is used to evacuate the vacuum chamber 10. An RF power source 28 is coupled to the upper electrode 14.

In use the nitrogen ($N_2$) and the inert sputter gases are introduced into the space between the electrodes 12 and 14 and are excited to a high energy state by the RF energy emitted from RF power source 28. Synthesis of an aluminum nitride (AlN) compound on the wafer 24 is accomplished by the release of aluminum (Al) atoms from the upper electrode 14 caused by the inert gas molecules striking the upper electrode 14. The free aluminum atoms combine with the energized nitrogen ($N_2$) gas molecules and are reactively deposited on the wafer to form a thin film of aluminum nitride (AlN). This process, although effective, is relatively expensive and complicated and is not generally suited to large scale semiconductor manufacture. In addition, the use of multiple gases introduces undesirable contaminants into the aluminum nitride (AlN) film.

Figure 2:
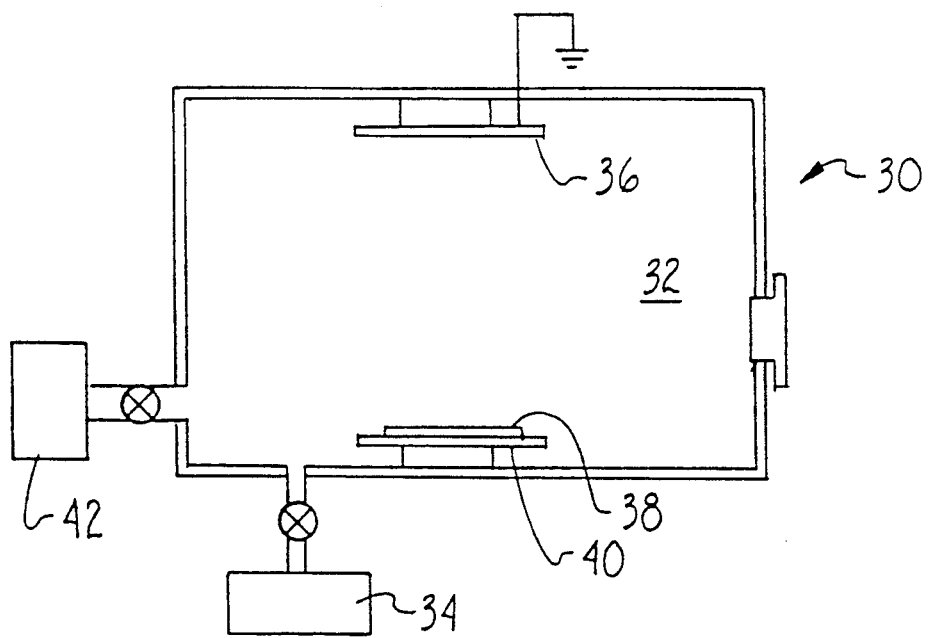
FIG. 2 is a schematic diagram of an apparatus for depositing an aluminum nitride (AlN) film in accordance with the invention.

The process of the present invention simplifies this prior art process by using only one gas, nitrogen ($N_2$), as both the sputter gas and the reactive gas. The process of the invention can be carried out in a standard sputter apparatus such as that shown in FIG. 2. With reference to FIG. 2, the sputter apparatus 30 includes a vacuum chamber 32 coupled to a vacuum source 34 and to a source of nitrogen ($N_2$) gas 42. Inside the vacuum chamber 32 is an aluminum target 36. The target 36 is electrically grounded. Semiconductor wafers 38 are mounted on a support surface 40 within the vacuum chamber 32.

In use nitrogen gas ($N_2$), is introduced into the vacuum chamber 32 and is ionized to a positive charge. The positively charged nitrogen atoms are attracted to the grounded target 36 and accelerate toward it. Upon striking the target 36 aluminum atoms are released. These aluminum atoms combine with nitrogen ($N_2$) molecules in the vacuum chamber 32 to form a thin film of aluminum nitride (AlN) on the surface of the wafer 38.

The nitrogen ($N_2$) gas thus serves the dual purpose of both the sputter gas and the reactive gas. This process offers several advantages for semiconductor manufacture. Among these advantages are:

1. The amount of impurity incorporation into the deposited aluminum nitride (AlN) film is reduced because only one gas source and one gas inlet is required.
2. The deposition process is simplified and adaptable to use in large scale semiconductor manufacture with reduced production costs.

3. The deposition process can be done in any conventional sputtering machine and an RF power source is not required.

In semiconductor manufacturing aluminum nitride (AlN) can be used for replacing alumina and beryllium oxide substrates used in microelectronic packaging. In this application aluminum nitride provides a better thermal expansion match to silicon. Additionally aluminum nitride (AlN) can be used as a high bandgap window for GaAs solar cells, as a mask for ion implantation and lift-off techniques, as a thermally conductive dielectric barrier, and as a ceramic package. Moreover, aluminum nitride is particularly favored as a substrate material in hybrid circuits.

Figure 3:
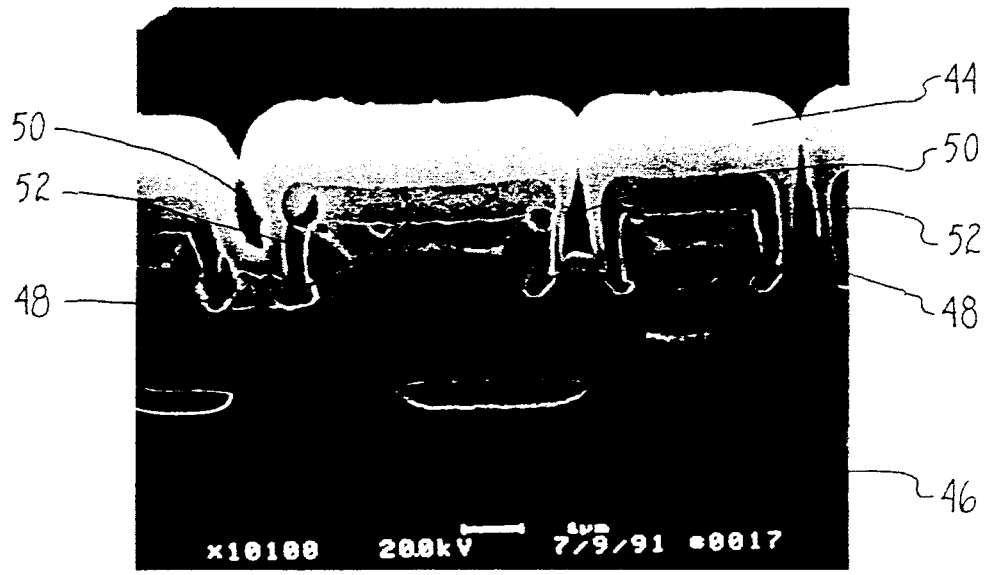
FIG. 3 is a scanning electron micrograph of a semiconductor wafer having a layer of aluminum nitride (AlN) deposited in accordance with the invention.

FIG. 3 is a cross-sectional scanning electron microscope of an aluminum nitride (AlN) layer 44 deposited by the process of the invention as a passivation layer. The aluminum nitride layer 44 has been deposited upon a silicon substrate 46 having patterned semiconductor devices 48 formed thereon. As illustrated in FIG. 3 a high quality aluminum nitride (AlN) film 44 is evenly distributed over the semiconductor devices 48. Additionally, step coverage extends in an area 50 between the semiconductor devices 48, and along the sidewalls 52 of the semiconductor devices 48, indicating a reasonably good step coverage obtained by this process. These new and unexpected results are provided by the simple yet unobvious process of the invention.

Figure 4:
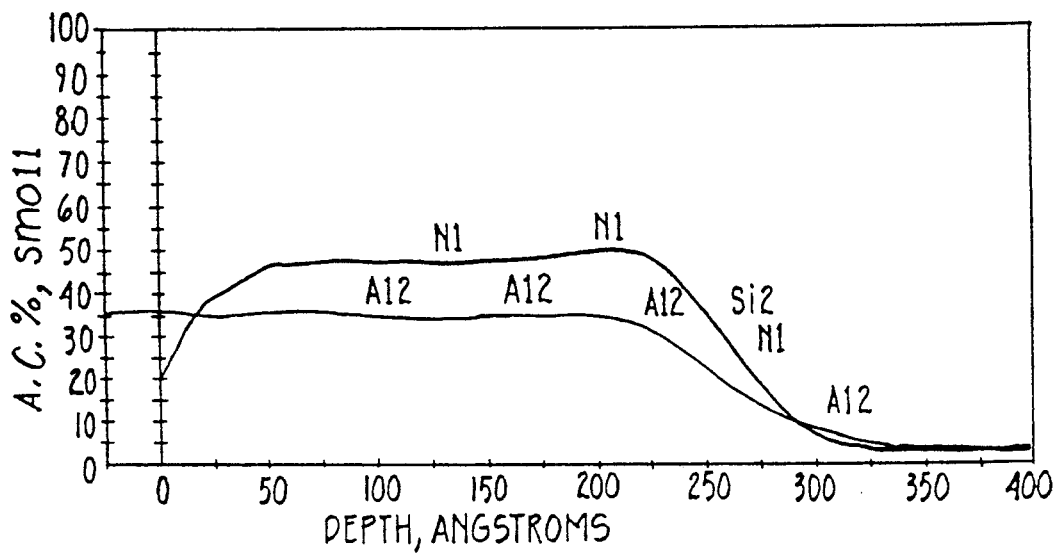
FIG. 4 is a graph illustrating an auger confirmation of an aluminum nitride (AlN) film deposited in accordance with the invention on a silicon substrate with the vertical axis being the atomic concentration and the horizontal axis the depth into the substrate.
Figure 5:
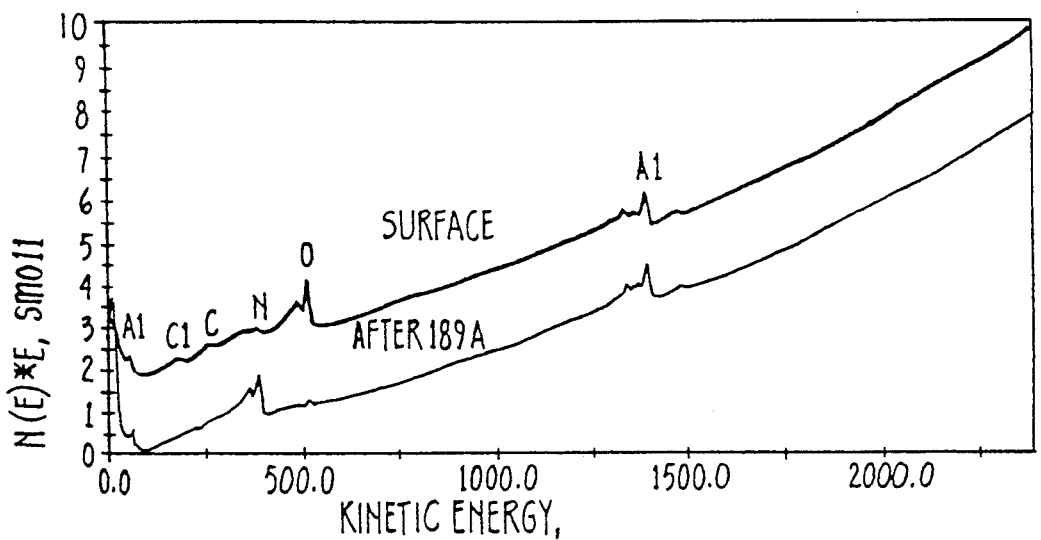
FIG. 5 is a graph illustrating an auger confirmation of an aluminum nitride (AiN) film deposited in accordance with the invention with atomic concentration plotted as a function of kinetic energy.

FIGS. 4 and 5 are auger spectroscopy confirmations of a 250 Å thick aluminum nitride (AlN) film deposited on Si substrate in accordance with the invention. FIGS. 4 and 5 illustrate the results of such an auger analysis. FIG. 4 shows the depth profile of AlN on a Si wafer. As is apparent from this data both Aluminum (Al) and Nitrogen (N) are present at the surface of the wafer as well as to a depth of between about 200-300 Å. Additionally, as is apparent in FIG. 5, the concentration of contaminants such as carbon (C) is relatively low.

Thus the invention provides a simple yet unobvious method of depositing a film of aluminum nitride (AlN) in a semiconductor manufacturing process. For use as a passivation layer the aluminum nitride (AlN) layer may be deposited after the pattern definition of the last metal layer. For use as packaging material the aluminum nitride (AlN) layer may be deposited after bond pads are open and the wafer is ready for packaging. The process may also be used to form a mask for ion implantation, as a high bandgap window for GaAs solar cells, and as a substrate material in hybrid circuits.

Figure 6A:
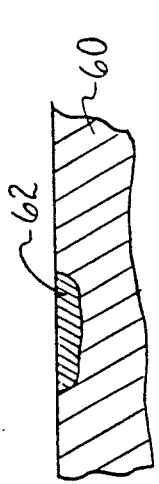
FIG. 6A-6G are schematic diagrams of a process sequence for forming an etchstop using the method of the invention.

The process of the invention is also particularly suited to the formation of an etchstop layer during semiconductor fabrication. A representative process sequence for such an application is shown in FIGS. 6A-6G. With reference to FIG. 6A a semiconducting substrate such as a silicon wafer 60 has a large number of semiconductor devices 62 formed thereon by standard techniques such as patterning, doping, and ion implantation. Item 62 may also be viewed as a junction to a device.

Figure 6B:
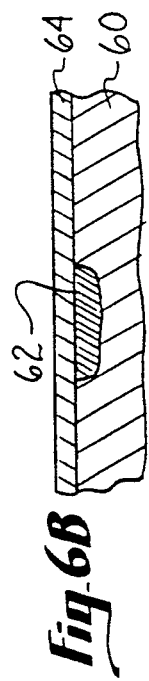

Next and as shown in FIG. 6B a layer of aluminum nitride (AlN) 64 is deposited in accordance with the invention by sputtering a target substrate of aluminum in a vacuum chamber using an energized nitrogen gas plasma as both a reactive gas and a sputter gas. A thin film of aluminum nitride (AlN) 64 (i.e. 1000 Å) formed by this process has a high purity as previously explained.

Figure 6C:
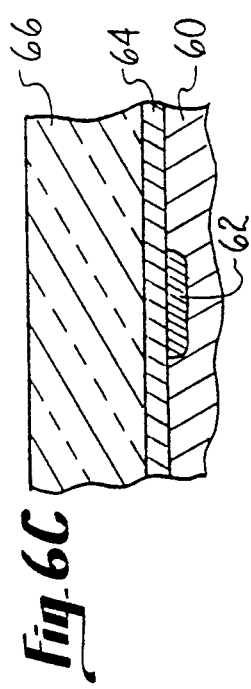

Next, as shown in FIG. 6C a dielectric or an oxide 66 is deposited over the aluminum nitride (AlN) layer 64.

Figure 6D:
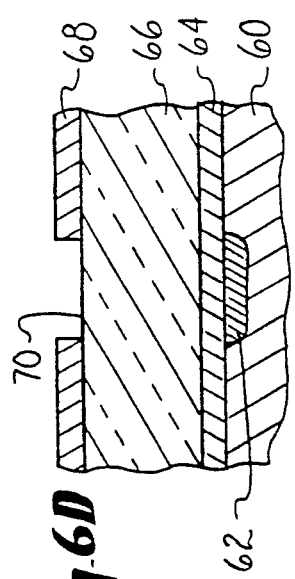

Next, as shown in FIG. 6D, photoresist 68 is deposited upon the oxide 66 and patterned to define regions 70 in the oxide layer 66 to be etched for forming contact vias to the devices 62.

Figure 6E:
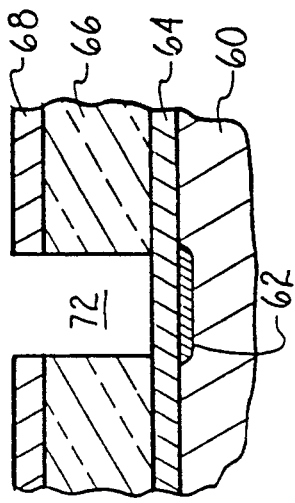

Next, as shown in FIG. 6E, a via or contact opening 72 is etched through the oxide layer using a process such as a reactive ion etch. The etch will stop on the thin aluminum nitride (AlN) layer. Due to the high etch selectivity of aluminum nitride (AlN) to oxide (oxide etches much faster than aluminum nitride (AlN)) the etch will stop at the aluminum nitride (AlN) layer 64, leaving the underlying silicon junction to the device 62 intact.

Figure 6F:
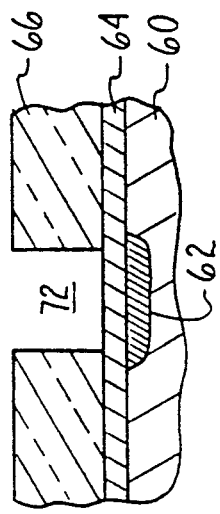
Figure 6G:
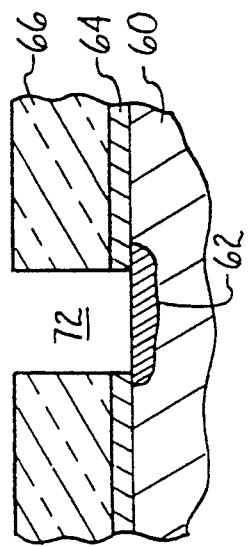

Next, as shown in FIG. 6F the photoresist 68 is stripped. Next, as shown in FIG. 6G the exposed aluminum nitride (AlN) in the contact via is stripped using either a wet or dry etch. Standard processes can then be used to complete formation and contact to the semiconducting devices 62.

This etchstop application of sputtered AlN has been tested by the inventors. A layer of 1000 Å aluminum nitride (AiN) film was first deposited atop of 150 mm diameter, <100> single crystal Si wafers. The AlN deposition was carried out in a DC magnetron sputter machine using high purity nitrogen gas. The wafers were next deposited with 18,000 Å of boron-phosphorus-silica-glass (BPSG). After an etch mask (photoresist) was defined in the BPSG layer by the standard photolithography technique, the oxide contact etch was carried out on these wafers with various overetch times. The oxide etch process used was a standard reactive ion etch technique using CF4 and CHF3 based chemistry. A cross-sectional scanning electron microscope (SEM) was used to determine the etch selectivity of (AlN) to oxide, as well as the effectiveness of a sputtered aluminum (AlN) film as an oxide etchstop. It was observed that aluminum nitride (AlN) was etched 10 times slower than that of (BPSG). For the wafers using an aluminum nitride (AlN) etchstop layer, there was no Si consumption observed for an overetch time as long as 45 seconds, while for the wafers without an aluminum nitride (AlN) etchstop layer, some Si consumption was observed.

Table 2 shows that the aluminum nitride (Aln) deposition rate using this process as a function of sputter deposition power.

TABLE 2

| (AlN) deposition using nitrogen as sputter and reactive gas as a function of sputter power. | |
|---|---|
| deposition rate (A/min) | sputter power (Kilowatt) |
| 70 | 1.8 |
| 210 | 2.4 |
| 280 | 3.0 |
| 420 | 3.6 |
| 720 | 6.0 | conditions:
N2 pressure (during sputtering) = 7.0 (millitorr)
N2 gas flow rate: 100 (cm³/minute)

Although only certain embodiments of the invention have been described herein, it will be apparent to one skilled in the art that changes and modifications may be made thereto without departing from the spirit and scope of the invention as claimed.

We claim:

1. In semiconductor manufacturing a sputtering process for forming an aluminum nitride etchstop layer comprising:
   depositing a layer of aluminum nitride (AlN) on a substrate by placing a target substrate of aluminum in a vacuum chamber and introducing an energized nitrogen gas plasma into the vacuum chamber while excluding other gases, with the nitrogen gas both a reactive gas and a sputter gas such that aluminum atoms are released from the target and deposited with nitrogen on a surface of the substrate;
   depositing a dielectric layer over the aluminum nitride (AlN) layer;
   photopatterning and etching the dielectric layer to form contact vias to the substrate using the aluminum nitride (AlN) layer as an etchstop; and
   removing the aluminum nitride (AlN) exposed in the contact vias.

2. The process as recited in claim 1 and wherein:
   etching the dielectric layer is with an ion etch.

3. The process as recited in claim 2 and wherein:
   $CF_4$ and $CHF_3$ are used during the ion etch.

4. The process as recited in claim 1 and wherein:
   the aluminum nitride (AlN) layer has a thickness range of 100 Å to 1000 Å.

5. The process as recited in claim 1 and wherein:
   the aluminum nitride is deposited with a sputter power or from 1.8 to 12.0 Kilowatts with an $N_2$ pressure of about 1 to 10 millitorr.

6. The process as recited in claim 5 and wherein:
   an $N_2$ gas glow rate during sputtering is about 100 $cm^3$/minute.

7. The process as recited in claim 1 and wherein:
   the dielectric is (BPSG).

8. The process as recited in claim 1 and wherein:
   the dielectric is overetched for as long as 45 seconds.

* * * * *